US008502388B2

(12) United States Patent  
Seo

(10) Patent No.: US 8,502,388 B2  
(45) Date of Patent: Aug. 6, 2013

(54) SEMICONDUCTOR DEVICE AND METHOD FOR FABRICATING THE SAME

(75) Inventor: Kouhei Seo, Toyama (JP)

(73) Assignee: Panasonic Corporation, Osaka (JP)

( * ) Notice: Subject to any disclaimer, the term of this patent is extended or adjusted under 35 U.S.C. 154(b) by 74 days.

(21) Appl. No.: 13/193,330

(22) Filed: Jul. 28, 2011

(65) Prior Publication Data

US 2011/0285028 A1 Nov. 24, 2011

Related U.S. Application Data

(63) Continuation of application No. PCT/JP2009/005681, filed on Oct. 28, 2009.

(30) Foreign Application Priority Data

Feb. 6, 2009 (JP) ................................ 2009-026384

(51) Int. Cl.  
*H01L 23/48* (2006.01)

(52) U.S. Cl.  
USPC .... 257/774; 257/773; 257/642; 257/E23.011; 257/E21.158; 438/666; 438/725

(58) Field of Classification Search  
USPC .................. 257/774, E23.011, E21.158, 773, 257/642; 438/666, 82, 725, 780  
See application file for complete search history.

(56) References Cited

U.S. PATENT DOCUMENTS

| 6,958,524 B2 * | 10/2005 | Li et al. ........................ 257/635 |
| 2002/0164891 A1 | 11/2002 | Gates et al. |
| 2002/0187625 A1 | 12/2002 | Shimooka et al. |
| 2005/0101157 A1 | 5/2005 | Yunogami et al. |
| 2007/0026669 A1 * | 2/2007 | Tsumura et al. ............. 438/637 |
| 2009/0072403 A1 * | 3/2009 | Ito et al. ........................ 257/751 |
| 2009/0321945 A1 | 12/2009 | Besling |

FOREIGN PATENT DOCUMENTS

| JP | 2003-068851 | 3/2003 |
| JP | 2003-273216 | 9/2003 |
| JP | 2005-142473 | 6/2005 |
| JP | 2008-159835 | 7/2008 |
| WO | WO 02/091450 A2 | 11/2002 |
| WO | WO 2006/100632 A1 | 9/2006 |

* cited by examiner

*Primary Examiner* — Thinh T Nguyen  
(74) *Attorney, Agent, or Firm* — McDermott Will & Emery LLP

(57) ABSTRACT

A semiconductor device has an insulating film, serving as low-porosity regions low in porosity, formed on a substrate and high-porosity regions higher in porosity than the low-porosity regions, and also includes copper interconnects formed to fill interconnect grooves in the insulating film. The insulating film is present under the interconnect grooves, and present in portions neighboring the sidewalls of the interconnect grooves.

15 Claims, 4 Drawing Sheets

SEMICONDUCTOR DEVICE AND METHOD FOR FABRICATING THE SAME

CROSS-REFERENCE TO RELATED APPLICATION

This is a continuation of PCT International Application PCT/JP2009/005681 filed on Oct. 28, 2009, which claims priority to Japanese Patent Application No. 2009-026384 filed on Feb. 6, 2009. The disclosures of these applications including the specifications, the drawings, and the claims are hereby incorporated by reference in their entirety.

BACKGROUND

The present disclosure relates to a semiconductor device and a method for fabricating the same, and more particularly to an interconnection technique of forming interconnects in a porous insulating film.

With decrease in the size of interconnects accompanying the recent enhancement in the integration density of semiconductor devices, the capacitance between interconnects has increased, and as a result, RC delay in interconnects has posed a problem. In view of this problem, there have been requests for reduction in the dielectric constant of an interlayer insulating film. As an interlayer insulating film with a reduced dielectric constant, a porous insulating film having pores formed in the insulating film is considered effective. However, with the presence of pores, a porous insulating film is susceptible to plasma damage during dry etching and ashing, and also easily impregnated with a cleaning solution during cleaning. As a result, the properties of the porous insulating film decrease, causing decrease in the electrical properties and reliability of the semiconductor devices.

To overcome the above problem, a method as follows is proposed (see Japanese Patent Publication No. 2005-142473, for example). That is, a non-porous insulating film containing a pore formation material is deposited on a silicon wafer, and then subjected to dry etching using a resist pattern formed on the non-porous insulating film as a mask, to form interconnect grooves and via holes in the non-porous insulating film. After removal of the remaining resist pattern by ashing, the surface of the non-porous insulating film is cleaned. Subsequently, the pore formation material is removed from the non-porous insulating film by heating, to form a porous insulating film. Thereafter, copper interconnects and vias are respectively formed in the interconnect grooves and the via holes with a barrier metal film interposed between the interconnects or the vias and the insulating film.

SUMMARY

After thorough examinations on the conventional method described above, the inventor of the present disclosure has found a problem as follows. According to the conventional method, portions of the insulating film located right under the interconnects become porous. Therefore, film delamination will occur between this porous insulating film and an insulating film underlying the porous insulating film.

In view of the above problem, it is an objective of the present disclosure to provide a semiconductor device having interconnects, and a method for fabricating such a semiconductor device, capable of achieving high yield and high reliability.

To solve the above problem, example means according to the present disclosure are as follows.

The semiconductor device of the present disclosure includes: an insulating film formed on a substrate; and interconnects each formed in an interconnect groove provided in the insulating film, wherein the insulating film has a low-porosity region low in porosity and a high-porosity region high in porosity, the low-porosity region is formed in a portion under the interconnect groove, and the high-porosity region is formed in a portion neighboring a sidewall of the interconnect groove.

In the semiconductor device described above, the top surface of the low-porosity region may adjoin the bottom of the interconnect groove.

In the semiconductor device described above, the top surface of the low-porosity region may substantially adjoin the entire bottom of the interconnect groove.

In the semiconductor device described above, the width of the bottom surface of the low-porosity region may be substantially equal to the width of the top surface of the low-porosity region and the width of the bottom of the interconnect groove.

In the semiconductor device described above, the position of the bottom surface of the low-porosity region may correspond with the position of the bottom surface of the insulating film.

In the semiconductor device described above, the low-porosity region may be further formed in a portion between the sidewall of the interconnect groove and the high-porosity region.

The semiconductor device described above may further include a via formed in a via hole provided under the interconnect groove in the insulating film, the via being electrically connected to the interconnect, wherein the low-porosity region covers the periphery of the via.

In the semiconductor device described above, the position of the top surface of the high-porosity region may correspond with the position of the top surface of the insulating film, and the position of the bottom surface of the high-porosity region may correspond with the position of the bottom surface of the insulating film.

In the semiconductor device described above, the porosity of the low-porosity region may be less than 10%, and the porosity of the high-porosity region may be 10% or more.

In the semiconductor device described above, the carbon concentration of the low-porosity region may be 20% or more, and the carbon concentration of the high-porosity region may be less than 20%.

In the semiconductor device described above, the diameter of pores present in the low-porosity region may be less than 0.8 nm, and the diameter of pores present in the high-porosity region may be 0.8 nm or more and less than 3.0 nm.

In the semiconductor device described above, the relative dielectric constant of the low-porosity region may be 2.8 or more, and the relative dielectric constant of the high-porosity region may be less than 2.8.

In the semiconductor device described above, the modulus of elasticity of the low-porosity region may be 10 GPa or more, and the modulus of elasticity of the high-porosity region may be less than 10 GPa.

In the semiconductor device described above, the insulating film may contain a pore formation material.

In the semiconductor device described above, the pore formation material may be porogen.

In the semiconductor device described above, only the high-porosity region may be formed between the adjacent interconnects.

The method for fabricating a semiconductor device of the present disclosure includes the steps of: (a) forming an insulating film on a substrate, the insulating film containing a pore formation material and having a first region and a second region; (b) removing the pore formation material contained in the first region, to define the first region as a high-porosity region high in porosity and the second region as a low-porosity region lower in porosity than the high-porosity region; and (c) forming an interconnect in the low-porosity region.

The method described above may further include, after the step (c), the step of (d) removing the pore formation material contained in a portion of the low-porosity region neighboring a sidewall of the interconnect.

In the method described above, the step (d) may be a step of removing the pore formation material by electron beam or ultraviolet irradiation.

In the method described above, the step (b) may be a step of removing the pore formation material contained in the first region after formation of a mask having an opening exposing the first region and covering the second region.

In the method described above, the step (b) may be a step of removing the pore formation material contained in the first region by irradiating the opening with an electron beam or ultraviolet.

In the method described above, the mask may be a metal hard mask.

In the method described above, the pore formation material may be porogen.

According to the example configurations of the present disclosure described above, in the semiconductor device having copper interconnects and the method for fabricating such a semiconductor device, occurrence of a short between interconnects and decrease in resistance between interconnects, which may occur due to diffusion of copper into an insulating film containing pores, can be prevented or reduced, whereby high yield and high reliability can be achieved.

DETAILED DESCRIPTION

The technical idea of the present disclosure will be clearly revealed in the following detailed description made with reference to the accompanying drawings. It should be noted that any person skilled in the art who has understood the preferred embodiment of the present disclosure will be able to make changes and modifications using the technique disclosed herein without departing from the technical idea and scope of the present disclosure.

Figure 1:
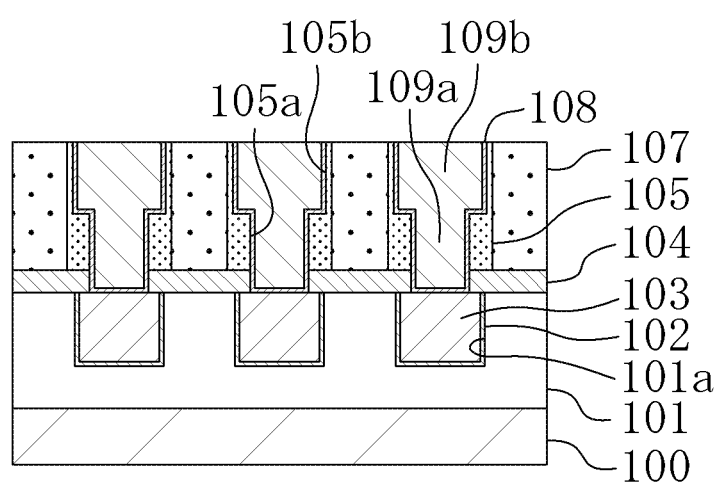
FIG. 1 is a cross-sectional view showing a structure of a semiconductor device of an example embodiment of the present disclosure.

FIG. 1 shows a structure of a semiconductor device of an example embodiment of the present disclosure.

As shown in FIG. 1, interconnect grooves 101a are formed in an insulating film 101 such as an SiOC film or an SiO$_2$ film having a thickness of 80-150 nm, for example, formed on a substrate 100 such as a silicon substrate, for example. A barrier metal film 102 such as a TiN film, a TaN film, or a Ta/TaN film having a thickness of 5-15 nm, for example, is formed on the bottoms and sidewalls of the interconnect grooves 101a. Copper interconnects 103 comprised of a copper film filling the interconnect grooves 101a are formed on the barrier metal film 102. A liner film 104 of a single-layer or multilayer structure comprised of one kind of film or a plurality of kinds of films selected from an SiOC film, an SiCN film, and an SiCO film having a thickness of 30-60 nm, for example, is formed over the insulating film 101, the barrier metal film 102, and the copper interconnects 103.

On the liner film 104, formed are: an insulating film 105 (non-porous insulating film: corresponding to low-porosity regions) such as an SiOC film having a thickness of 150-250 nm, for example, that contains porogen, for example, as a pore formation material; and an insulating film 107 (porous insulating film: corresponding to high-porosity regions) such as an SiOC film having a thickness of 150-250 nm, for example, that has a number of pores. Via holes 105a reaching the surfaces of the copper interconnects 103 at their bottoms are formed in the liner film 104 and the insulating film 105, and interconnect grooves 105b communicating with the via holes 105a are formed in the insulating film 105. A barrier metal film 108 such as a TiN film, a TaN film, or a Ta/TaN film having a thickness of 5-15 nm, for example, is formed on the bottoms and sidewalls of the via holes 105a and the interconnect grooves 101a. Vias 109a comprised of a copper film filling the via holes 105a are formed on the barrier metal film 108, and copper interconnects 109b comprised of a copper film filling the interconnect grooves 105b are formed on the barrier metal film 108.

Note that the insulating film 105 (non-porous insulating film) satisfies at least one of the following conditions: a porosity of less than 10%, a carbon concentration of 20% or more, a pore diameter of less than 0.8 nm, a relative dielectric constant of 2.8 or more, and a modulus of elasticity of 10 GPa or more. Also, the insulating film 107 (porous insulating film) satisfies at least one of the following conditions: a porosity of 10% or more, a carbon concentration of less than 20%, a pore diameter of 0.8 nm or more and less than 3.0 nm, a relative dielectric constant of less than 2.8, and a modulus of elasticity of less than 10 GPa.

FIGS. 2A-2D and 3A-3C show a method for fabricating the semiconductor device of the example embodiment of the present disclosure in the sequence of the steps that are performed.

Figure 2A:
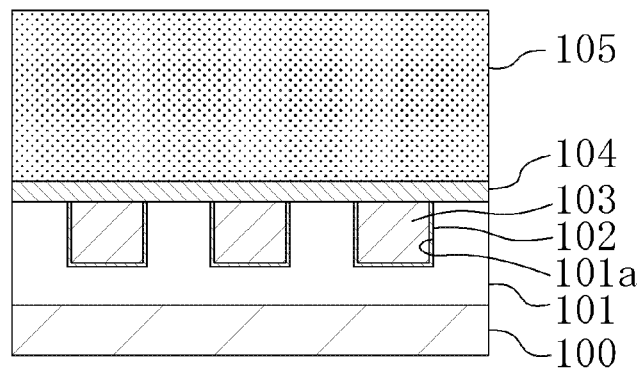
FIGS. 2A-2D are cross-sectional views showing a method for fabricating the semiconductor device of the example embodiment of the present disclosure in the sequence of the steps that are performed.

First, as shown in FIG. 2A, the insulating film 101 such as an SiOC film or an SiO$_2$ film having a thickness of 80-150 nm, for example, is formed on the substrate 100 such as a silicon substrate by plasma CVD, for example. The interconnect grooves 101a are then formed in the insulating film 101 by normal photolithography and etching. Subsequently, a conductive film such as a TiN film, a TaN film, or a Ta/TaN film having a thickness of 5-15 nm, for example, is formed on the top surface of the insulating film 101 and on the bottoms and sidewalls of the interconnect grooves 101a, and then a seed layer (not shown) is deposited to form a copper film by electrolytic plating. The portions of the conductive film and the copper film located outside the interconnect grooves 101a are removed by CMP to flatten the surface, thereby forming the barrier metal film 102 comprised of the conductive film, and the copper interconnects 103 comprised of the seed layer and the cooper film, on the bottoms and sidewalls of the interconnect grooves 101a. Subsequently, the liner film 104 of a single-layer or multilayer structure comprised of one kind of film or a plurality of kinds of films selected from an SiOC film, an SiCN film, and an SiCO film having a thickness of 30-60 nm, for example, is formed on the exposed surfaces of the insulating film 101, the barrier metal film 102, and the copper interconnects 103.

Thereafter, the insulating film 105 (non-porous insulating film: corresponding to low-porosity regions) such as an SiOC film having a thickness of 200-350 nm, for example, that contains porogen, for example, as the pore formation material is formed on the liner film 104 by plasma CVD. As discussed earlier, the insulating film 105 (non-porous insulating film) satisfies at least one of the following conditions: a porosity of less than 10%, a carbon concentration of 20% or more, a pore diameter of less than 0.8 nm, a relative dielectric constant of 2.8 or more, and a modulus of elasticity of 10 GPa or more.

Figure 2B:
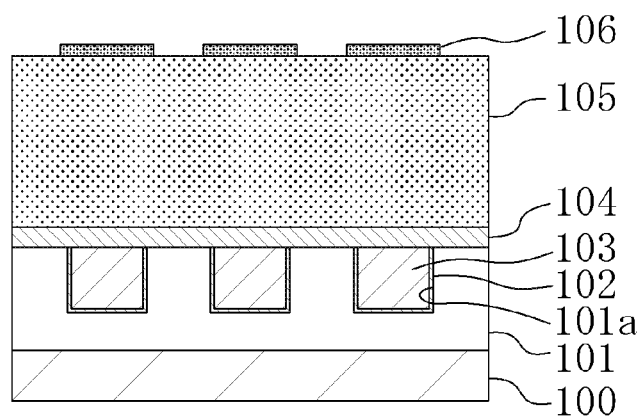

Next, as shown in FIG. 2B, a TiN film having a thickness of 5-20 nm, for example, is deposited on the insulating film 105 (non-porous insulating film) and then subjected to normal photolithography and etching, to form a metal hard mask 106 made of TiN, for example, patterned to cover regions in which the via holes 105a and the interconnect grooves 105b are to be formed later.

Figure 2C:
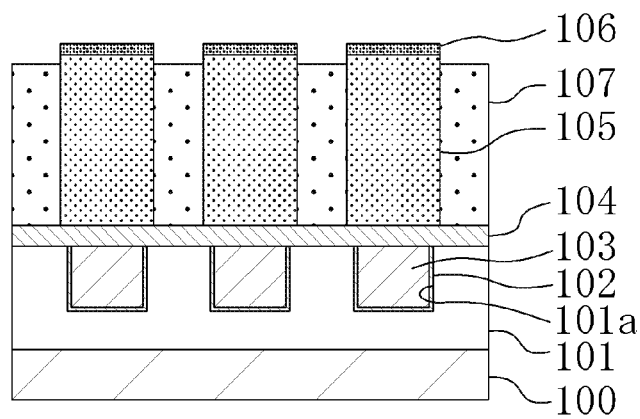

Next, as shown in FIG. 2C, the insulating film 105 (non-porous insulating film) is subjected to electron beam or ultraviolet irradiation using the metal hard mask 106, thereby removing porogen contained in portions of the insulating film 105 (non-porous insulating film) that are not covered with the metal hard mask 106. In this way, the portions of the insulating film 105 (non-porous insulating film) that are not covered with the metal hard mask 106 (portions corresponding to openings of the metal hard mask), i.e., portions of the insulating film 105 (non-porous insulating film) that are to become regions between interconnect grooves to be formed later are defined as the insulating film 107 (porous insulating film: corresponding to high-porosity regions) having a number of pores generated by the removal of porogen.

Figure 2D:
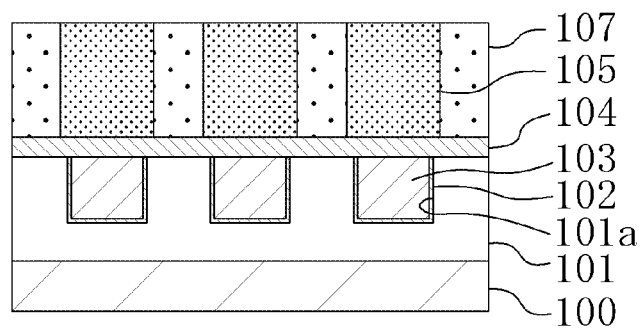

Then, as shown in FIG. 2D, while the metal hard mask 106 is removed, the insulating film 105 (non-porous insulating film) and the insulating film 107 (porous insulating film) are thinned to a thickness of 150-250 nm by CMP. Here, the width of the portions of the insulating film 105 (non-porous insulating film) sandwiched by the adjacent portions of the insulating film 107 (porous insulating film) (width in the direction horizontal to the principal plane of the substrate 100) is 70-110 nm. Also, the width of the portions of the insulating film 107 (porous insulating film) sandwiched by the adjacent portions of the insulating film 105 (non-porous insulating film) (width in the direction horizontal to the principal plane of the substrate 100) is 40-80 nm. The insulating film 107 (porous insulating film) satisfies at least one of the following conditions: a porosity of 10% or more, a carbon concentration of less than 20%, a pore diameter of 0.8 nm or more and less than 3.0 nm, a relative dielectric constant of less than 2.8, and a modulus of elasticity of less than 10 GPa.

Figure 3A:
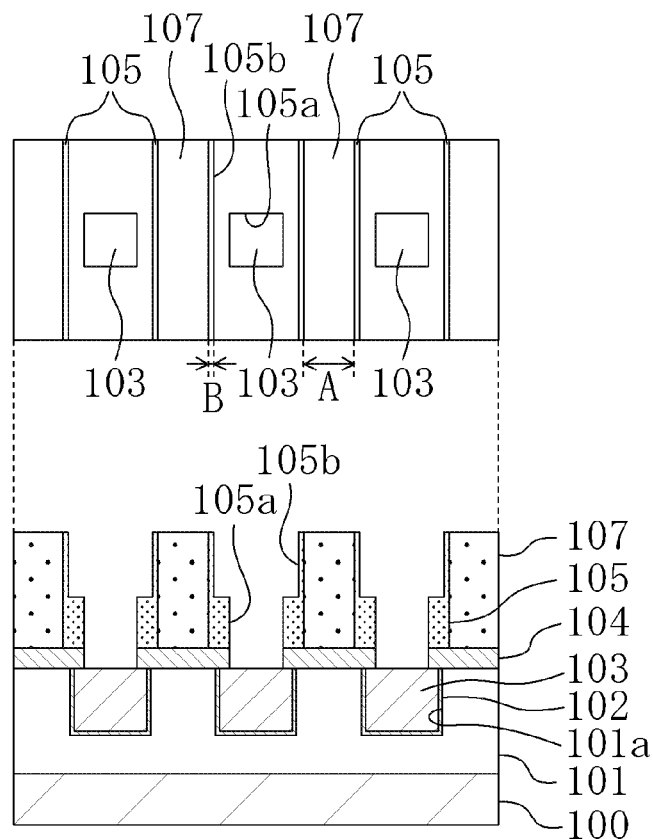
FIGS. 3A-3C are cross-sectional views showing the method for fabricating the semiconductor device of the example embodiment of the present disclosure in the sequence of the steps that are performed, in which FIG. 3A also shows a corresponding plan view.

Next, as shown in FIG. 3A, the via holes 105a exposing portions of the surfaces of the copper interconnects 103 at their bottoms are formed in the liner film 104 and the insulating film 105 (non-porous insulating film), and the interconnect grooves 105b communicating with the via holes 105a are formed in the insulating film 105 (non-porous insulating film), by normal mask formation, lithography, and dry etching processes. For formation of the via holes 105a and the interconnect grooves 105, it is possible to adopt any of a process using a resist mask, a process using a hard mask of an insulating film, and a process using a hard mask made of metal. The width of the interconnect grooves 105b (corresponding to width A in the plan view in FIG. 3A) is 60-90 nm.

Also, the width of portions of the insulating film 105 (non-porous insulating film) each present between the sidewall of the interconnect groove 105b and the insulating film 107 (corresponding to width B in the plan view in FIG. 3A) is 5-10 nm. Accordingly, it is preferable that the ratio of the width B to the pore diameter mentioned above (0.8 nm or more and less than 3.0 nm) is about 1.5 to 12.5.

Figure 3B:
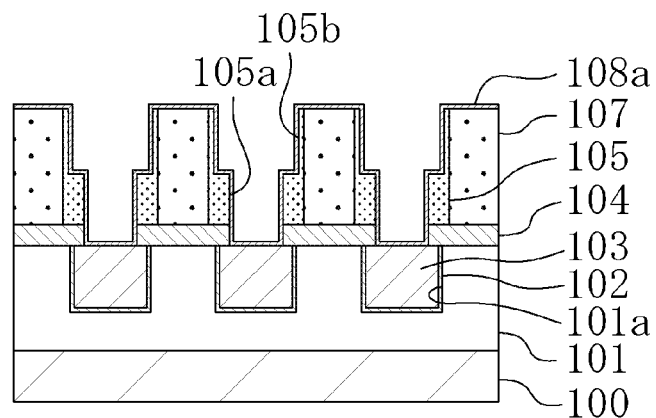

Then, as shown in FIG. 3B, a conductive film 108a having a layered structure of a TaN film and a Ta film having a thickness of 5-15 nm, for example, is formed on the top surfaces of the insulating film 105 (non-porous insulating film) and the insulating film 107 (porous insulating film) and on the bottoms and sidewalls of the via holes 105a and the interconnect grooves 101a.

Figure 3C:
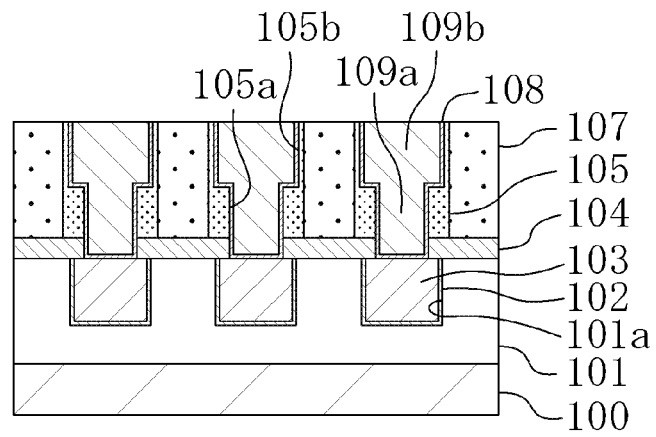

Then, as shown in FIG. 3C, after deposition of a seed layer (not shown), a copper film is formed by electrolytic plating and then subjected to annealing. The portions of the conductive film 108a and the copper film located outside the interconnect grooves 105b are removed by CMP to flatten the surface, thereby forming the barrier metal film 108 comprised of the conductive film 108a on the bottoms and sidewalls of the via holes 105a and the interconnect grooves 105b. Simultaneously, the vias 109a comprised of the copper film are formed on the barrier metal film 108 to fill the via holes 105a, and the copper interconnects 109b comprised of the copper film are formed on the barrier metal film 108 to fill the interconnect grooves 105b.

According to the method for fabricating the semiconductor device of the example embodiment described above, in the step shown in FIG. 3A, the via holes 105a and the interconnect grooves 105b are formed in the insulating film 105 (non-porous insulating film), not in the insulating film 107 (porous insulating film) having a number of pores. Therefore, no pores will be exposed at the sidewalls of the via holes 105a and the bottoms and sidewalls of the interconnect grooves 105b.

In the conventional technique described above, pores generated by removal of the pore formation material are exposed at the sidewalls and bottoms of the interconnect grooves formed in the porous insulating film and the sidewalls of the via holes also formed in the porous insulating film. Therefore, the copper constituting the interconnects is likely to diffuse into the porous insulating film through such pores exposed at the surfaces of the interconnect grooves via the barrier metal film. This occurrence is more evident when the barrier metal film is thinned, becoming insufficient in barrier property, due to tradeoffs for the recent trend toward miniaturization and reduction in capacitance between interconnects. Moreover, in the formation of the barrier metal film on the interconnect grooves and the via holes, the coverage of the barrier metal film decreases due to the exposed pores. Therefore, at positions where pores are exposed at the sidewalls of the interconnect grooves and the via holes, the barrier metal film may be thinly deposited, or even may not be deposited. As a result, at the positions of pores exposed at the sidewalls of the interconnect grooves, in particular, the barrier property of the barrier metal film against copper decreases, causing copper to easily diffuse into the porous insulating film. As described above, according to the conventional technique, copper in the interconnects is likely to diffuse into the porous insulating film via pores exposed at the interconnect grooves. Since a short may occur between interconnects due to the diffusion of copper, the yield and reliability of the semiconductor device greatly decrease.

By contrast, according to the method for fabricating the semiconductor device of the example embodiment of the present disclosure, no pores are exposed at the sidewalls of the via holes 105a and the bottoms and sidewalls of the interconnect grooves 105b. It is therefore possible to prevent the problem that copper is likely to diffuse into the insulating film 105 (non-porous insulating film) and the insulating film 107 (porous insulating film) via pores exposed at the surfaces of the interconnect grooves 105b. Moreover, the barrier metal film 108 is formed on the bottoms and sidewalls of the via holes 105a and the interconnect grooves 105b entirely with good coverage. It is therefore possible to prevent thinning of the barrier metal film 108 at the positions of pores exposed at the surfaces of the interconnect grooves 105b. As a result, it is possible to prevent diffusion of copper constituting the copper interconnects 109b and the vias 109a into the insulating film 105 (non-porous insulating film) and the insulating film 107 (porous insulating film). Thus, since occurrence of a short between interconnects and decrease in resistance between interconnects are prevented, the yield and reliability of the semiconductor device improve.

Since the insulating film 105 (non-porous insulating film) excellent in film strength is present under the interconnect grooves 105b entirely, the occurrence of film delamination between the insulating film 105 and the underlying liner film 104 can be prevented or reduced. Also, since the insulating film 105 (non-porous insulating film), not the insulating film 107 (porous insulating film), is present surrounding the via holes 105a, a problem that water, etc. contained in pores may adhere to the vias and cause oxidation can be prevented or reduced. Moreover, since the insulating film 107 (porous insulating film) low in dielectric constant is present in most part of each gap between the adjacent interconnects 109b, increase in parasitic capacitance can be prevented or reduced. Furthermore, the insulating film 105 (non-porous insulating film) is present between each interconnect 109b and the insulating film 107 (porous insulating film). With this configuration, the occurrence of diffusion of copper via exposed pores that may be formed in the insulating film 107 (porous insulating film) can be further prevented or reduced. Also, this configuration is effective when it is desired to increase the film strength of the sidewalls of the interconnects 109b, such as when the distance between the interconnects 109b is long.

VARIATION OF EXAMPLE EMBODIMENT

Figure 4:
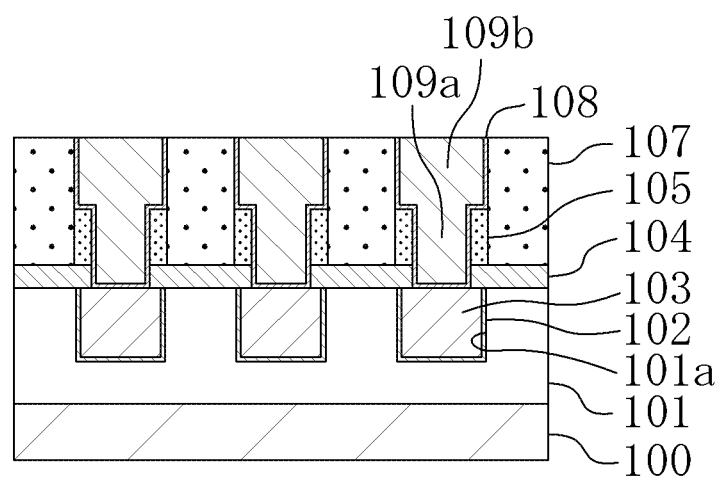
FIG. 4 is a cross-sectional view showing a structure of a semiconductor device of a variation of the example embodiment of the present disclosure.

FIG. 4 shows a structure of a semiconductor device of a variation of the example embodiment of the present disclosure.

As shown in FIG. 4, the semiconductor device of a variation of the example embodiment of the present disclosure is the same in structure as the semiconductor device shown in FIG. 1, except that the portions of the barrier metal film 108 present on the sidewalls of the interconnect grooves 105b adjoin the insulating film 107 (porous insulating film). More specifically, although there are regions of the insulating film 105 (non-porous insulating film) between the portions of the barrier metal film 108 present on the sidewalls of the interconnect grooves 105b and the insulating film 107 (porous insulating film) in the semiconductor device shown in FIG. 1, such regions are not present and the insulating film 107 (porous insulating film) occupies such regions in the semiconductor device of FIG. 4. Also, the portions of the insulating film 105 present on the sidewalls of the vias 15a are thinned from the side adjoining the insulating film 107 (porous insulating film) by the film thickness of the above regions. In other words, in the structure of the semiconductor device shown in FIG. 4, the portions of the insulating film 105 (non-porous insulating film) located outside the sidewalls of the interconnect grooves 105b from top to bottom are changed to constitute the insulating film 107 (porous insulating film).

A method for fabricating the semiconductor device of the variation of the example embodiment of the present disclosure will be described. After completion of the steps shown in FIGS. 2A-2D and 3A-3C, porogen contained in the portions of the insulating film 105 (non-porous insulating film) present outside the sidewalls of the interconnect grooves 10b from top to bottom is removed by electron beam or ultraviolet irradiation, to allow the portions to constitute part of the insulating film 107. In this way, the structure of the semiconductor device shown in FIG. 4 is attained. Naturally, it is not only the portions of the insulating film 105 located outside the barrier metal film 108 at the sidewalls of the interconnect grooves 10b from top to bottom that are changed from the insulating film 105 to the insulating film 107 by the electron beam or ultraviolet irradiation, but also portions of the insulating film 105 (non-porous insulating film) surrounding the via holes 105a present inside with respect to the sidewalls of the interconnect grooves 10b may become part of the insulating film 107 in some cases. Thus, in the structure of the semiconductor device of the variation of the example embodiment of the present disclosure and the method for fabricating such a semiconductor device, it is preferable that the width of portions of the insulating film 105 (non-porous insulating film) remaining on the sidewalls of the via holes 105a (width in the direction horizontal to the principal plane of the substrate 100) is in the range of 0 to 10 nm.

According to the structure of the semiconductor device of the variation of the example embodiment of the present disclosure and the method for fabricating such a semiconductor device, the advantage described with reference to FIGS. 1A-3C can also be obtained.

Moreover, since the insulating film 105 (non-porous insulating film) is not formed, but only the insulating film 107 (porous insulating film) is present, between the adjacent copper interconnects 109b, the capacitance between interconnects can be further reduced compared with the structure of the semiconductor device shown in FIG. 1, permitting implementation of a semiconductor device with higher performance.

Although formation of the vias 109a and the copper interconnects 109b using the dual-damascene process was described in the example embodiment, the advantage described above can also be obtained when using a single-damascene process.

It should be noted that the materials and values specified in the above example embodiment were presented as preferred examples, and, naturally, the present disclosure is not limited to these materials and values.

As described above, the present disclosure is useful for a method of forming copper interconnects in semiconductor devices.

What is claimed is:
1. A semiconductor device, comprising:
an insulating film formed on a substrate;
interconnects each formed in an interconnect groove provided in the insulating film; and
a via formed in a via hole provided under the interconnect groove in the insulating film, the via being electrically connected to the interconnect,
wherein the insulating film has a low-porosity region low in porosity and a high-porosity region high in porosity,
the low-porosity region is formed in a portion under the interconnect groove and disposed between the via and the high-porosity region, the high-porosity region is formed in a portion neighboring a sidewall of the interconnect groove, a diameter of pores present in the low-porosity region is less than 0.8 nm, and a diameter of pores present in the high-porosity region is 0.8 nm or more and less than 3.0 nm.

2. The semiconductor device of claim 1, wherein a top surface of the low-porosity region adjoins a bottom of the interconnect groove.

3. The semiconductor device of claim 1, wherein a top surface of the low-porosity region substantially adjoins an entire bottom of the interconnect groove.

4. The semiconductor device of claim 1, wherein a width of a bottom surface of the low-porosity region is substantially equal to a width of a top surface of the low-porosity region and a width of a bottom of the interconnect groove.

5. The semiconductor device of claim 1, wherein a position of a bottom surface of the low-porosity region corresponds with a position of a bottom surface of the insulating film.

6. The semiconductor device of claim 1, wherein the low-porosity region is further formed in a portion between the sidewall of the interconnect groove and the high-porosity region.

7. The semiconductor device of claim 6, wherein a width of the portion of the low-porosity region formed between the sidewall of the interconnect groove and the high-porosity region is smaller than a width of the portion of the low-porosity region formed under the interconnect groove.

8. The semiconductor device of claim 1, wherein
a position of a top surface of the high-porosity region corresponds with a position of a top surface of the insulating film, and
a position of a bottom surface of the high-porosity region corresponds with a position of a bottom surface of the insulating film.

9. The semiconductor device of claim 1, wherein
a porosity of the low-porosity region is less than 10%, and
a porosity of the high-porosity region is 10% or more.

10. The semiconductor device of claim 1, wherein
a carbon concentration of the low-porosity region is 20% or more, and
a carbon concentration of the high-porosity region is less than 20%.

11. The semiconductor device of claim 1, wherein
a relative dielectric constant of the low-porosity region is 2.8 or more, and
a relative dielectric constant of the high-porosity region is less than 2.8.

12. The semiconductor device of claim 1, wherein
a modulus of elasticity of the low-porosity region is 10 GPa or more, and
a modulus of elasticity of the high-porosity region is less than 10 GPa.

13. The semiconductor device of claim 1, wherein the insulating film contains a pore formation material.

14. The semiconductor device of claim 13, wherein the pore formation material is porogen.

15. The semiconductor device of claim 1, wherein only the high-porosity region is formed between the adjacent interconnects.

* * * * *